(12) United States Patent
Gallagher et al.

(10) Patent No.: US 8,846,529 B2
(45) Date of Patent: Sep. 30, 2014

(54) ELECTROLESS PLATING OF COBALT ALLOYS FOR ON CHIP INDUCTORS

(71) Applicant: International Business Machines Corporation, Armonk, NY (US)

(72) Inventors: William J. Gallagher, Ardsley, NY (US); Eugene J. O'Sullivan, Nyack, NY (US); Naigang Wang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/738,139

(22) Filed: Jan. 10, 2013

(65) Prior Publication Data

US 2014/0191361 A1  Jul. 10, 2014

(51) Int. Cl.
*H01L 21/768* (2006.01)
*H01L 43/12* (2006.01)
*H01L 43/02* (2006.01)
*H01L 49/02* (2006.01)
*H01L 21/28* (2006.01)

(52) U.S. Cl.
CPC .............. *H01L 43/12* (2013.01); *H01L 43/02* (2013.01); *H01L 28/10* (2013.01); *H01L 21/28* (2013.01)
USPC ....................................................... 438/678

(58) Field of Classification Search
CPC ....... H01L 28/10; H01L 21/283; H01L 21/28; H01L 2224/11462
USPC .......................................................... 438/678
See application file for complete search history.

(56) References Cited

U.S. PATENT DOCUMENTS

| | | | |
|---|---|---|---|
| 6,030,877 A | 2/2000 | Lee et al. | |
| 7,008,871 B2 | 3/2006 | Andricacos et al. | |
| 7,719,084 B2 * | 5/2010 | Gardner et al. | 257/531 |
| 7,772,106 B2 * | 8/2010 | Lin et al. | 438/614 |
| 7,863,183 B2 * | 1/2011 | Daubenspeck et al. | 438/629 |
| 8,308,858 B2 | 11/2012 | Stewart et al. | |
| 2008/0003699 A1 | 1/2008 | Gardner et al. | |
| 2008/0090079 A1 | 4/2008 | Fajardo et al. | |
| 2012/0269987 A1 | 10/2012 | Dordi et al. | |
| 2012/0279866 A1 | 11/2012 | Fredenberg et al. | |
| 2012/0282768 A1 | 11/2012 | Yu et al. | |

FOREIGN PATENT DOCUMENTS

JP   2012216722 A   11/2012

OTHER PUBLICATIONS

Armyanov et al., "Crystalline and Amorphous Electroless Co-W-P. Coatings" Journal of the Electrochemical Society, 152 (9), Jul. 2005, pp. C612-C619.

Fujimori et al., "Magnetostriction of Cobase amorphous alloys and high frequency permeability in their sputtered thin films (invited)" J. Appl. Phys. 55(6), Mar. 1984, pp. 1769-1774.

Gardner et al., "Integrated on-chip inductors using magnetic material (invited)" J. Appl. Phys. 103, Apr. 2008. (6 pages).

(Continued)

*Primary Examiner* — William D Coleman
(74) *Attorney, Agent, or Firm* — Tutunjian & Bitetto, P.C.; Vazken Alexanian

(57) ABSTRACT

A method for forming an on-chip magnetic structure includes forming a seed layer over a substrate of a semiconductor chip. The seed layer is patterned to provide a plating location. A cobalt based alloy is electrolessly plated at the plating location to form an inductive structure on the semiconductor chip.

20 Claims, 7 Drawing Sheets

(56) References Cited

OTHER PUBLICATIONS

Hayashi et al., "Magnetic and other properties and sputtering behavior of Cobase amorphous alloy films" J. Appl. Phys. 61(8), Apr. 1987, pp. 2983-2992.

Lee et al., "Fabrication and Analysis of High-Performance Integrated Solenoid Inductor with Magnetic Core" IEEE Transactions on Magnetics, vol. 44, No. 11, Nov. 2008, pp. 4089-4095.

Nakano et al., "Electroless Deposited Cobalt-Tungsten-Boron Capping Barrier Metal on Damascene Copper Interconnection" J. Electrochem. Soc., vol. 152, Issue 3, Feb. 2005, pp. C163-C166.

Petrov et al., "Electrochemical Study of the Electroless Deposition of Co(P) and Co(W, P) Alloys" J. Electrochem. Soc., vol. 149(4), Feb. 2002, pp. C187-C194.

Wu et al., "Investigation of Electroless Co(W, P) Thin Film as the Diffusion Barrier of Underbump Metallurgy" J. Electrochem. Soc., 155(5), Mar. 2008, pp. D369-D376.

Gallagher, W., et al. "Electroless Plating of Cobalt Alloys for on Chip Inductors" Office Action mailed on Feb. 28, 2014 for U.S. Appl. No. 13/968,107. (12 Pages).

* cited by examiner

ELECTROLESS PLATING OF COBALT ALLOYS FOR ON CHIP INDUCTORS

BACKGROUND

1. Technical Field

The present invention relates to electroless plating, and more particularly to Co-based electroless plating for semiconductor devices.

2. Description Of The Related Art

On-chip magnetic inductors or transformers are passive elements that find wide applications in on-chip power converters and radio-frequency integrated circuits. On-chip magnetic inductors or transformers are composed of a set of conductors (e.g., copper lines) to carry the currents and a magnetic yoke/core to store magnetic energy.

High performance magnetic core materials often determine the performance of the inductors both in inductance (L) and quality factor (Q), especially in the high frequency range (>10 MHz). The figures of merit for the soft magnetic materials used for on-chip inductors are high permeability, high moment, low coercivity, high anisotropy, and high electrical resistivity.

Co-based amorphous alloys such as Co—Zr—Ta, Co—Zr—Nb and similar systems are particularly of note. These Co-based amorphous alloys have superior magnetic properties and relative high electrical resistivity. The amorphization of the cobalt is achieved by introducing small amounts of glass forming elements, mostly non-magnetic transition metals (e.g., Ti, Zr, Nb, Ta, W and so on). These elements can also be used to tune the magnetic properties, e.g., magnetostriction. On-chip inductors incorporated with such materials show favorable high-frequency response. However, these Co-based amorphous alloys are deposited mostly by vacuum deposition techniques (e.g. sputtering). This is because most transition metals are too noble to be reduced electrochemically in an aqueous solution.

Vacuum methods usually have low deposition rates, generally do not have good conformal coverage and the derived magnetic films are difficult to pattern subtractively due to the challenges of mask alignment and long etching times. In addition, such thick film sputtering requires high vacuum and frequent system maintenance due to collateral coating of chamber walls, which makes sputter processing expensive and hinders practical integration and manufacture of these materials. The deposition processes can result in high stress on a wafer, and, in particular, on large scale wafers (e.g., >200 mm).

SUMMARY

A method for forming an on-chip magnetic structure includes forming a seed layer over a substrate of a semiconductor chip. The seed layer is patterned to provide a plating location. A cobalt based alloy is electrolessly plated at the plating location to form a magnetic structure on the semiconductor chip.

A method for forming an on-chip magnetic structure includes forming an adhesion layer over a substrate of a semiconductor chip; forming a seed layer on the adhesion layer; forming a protective layer over the seed layer; patterning the seed layer and the protective layer to provide a plating location; removing the protective layer; and electrolessly plating a cobalt or iron based alloy at the plating location to form a magnetic structure on the semiconductor chip.

An on-chip magnetic structure includes a patterned seed layer formed over a substrate of a semiconductor chip to provide a plating location. A magnetic structure is formed including an electrolessly plated cobalt based alloy at the plating location, the inductive structure including at least one of a yoke and a coil.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
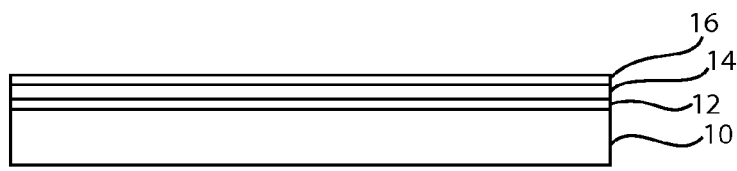
FIG. 1 is a cross-sectional view of a substrate having an adhesion layer, a seed layer and a protective layer formed thereon in accordance with the present principles.

In accordance with the present principles, methods and devices are disclosed where amorphous Co-based magnetic films are deposited through electroless plating. The present processes are simple and have many advantages over vacuum deposition. The electroless-plated magnetic materials show excellent magnetic and electrical properties that are comparable to those of most amorphous Co-based alloys. In addition, these magnetic materials and the processing methods can be easily integrated into many on-chip inductor or transformer structures, e.g., a closed-yoke or shielded-slab structure, etc.

Electroless plating is similar to electroplating except that no outside current is needed. Electrons derived from heterogeneous oxidation of a reducing agent at a catalytically active surface reduce metal ions to form metal deposits on a surface. Reducing agents may include hypophosphite, borohydride and amine borane (e.g., dimethylamine borane (DMAB)). Phosphorous (P) and boron (B) are usually co-deposited with metals to form alloys. Possible material systems may include CoP, CoB, CoWP, CoWB, CoWPB, CoMoP, CoMoB, mixtures and alloys or these and other materials. For example, Ni and Fe can be incorporated into the system to tune the magnetic properties. Fe can also replace Co to form Fe-based systems with similar foreign elements.

Electroless processing employs an inexpensive deposition setup with relatively inexpensive chemicals. Patterning is done on thin seed layers. Magnetic materials are selectively deposited on patterned seeds so that no plating molds are needed. High selectivity deposition results in small global stress, even on large scale wafers. Excellent conformal coverage is also achieved, and no current density distribution problems, often seen in electroplating processes, are present. The electroless deposition processes are efficient at uniformly depositing materials across large scale wafers (e.g., >200 mm), and can even plate multiple wafers simultaneously.

It is to be understood that the present invention will be described in terms of a given illustrative architectures having a wafer or substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIGS. 1-6, an electroless plating process for forming an on-chip magnetic component is illustratively shown. The magnetic components may include inductors, transformers, magnetic yokes, magnets, etc. Magnetic properties are particularly sensitive for on-chip inductors. Inductors need a thickness larger than about 100 nm and can be up to about 10 microns.

Referring to FIG. 1, a substrate 10 is provided for the formation of an electroless plating feature in accordance with the present principles. The substrate 10 may be part of a wafer or may be a stand-alone substrate. The substrate 10 may include silicon or other substrate material, e.g., GaAs, InP, SiC, etc. An adhesion layer 12 is deposited on the substrate 10 to permit the formation of a seed layer thereon. This adhesion layer is optionally employed and is used to improve the adhesion between a seed layer 14 and the substrate 10. The seed layer 14 is deposited on the adhesion layer 12. The adhesion layer 12 may include Ti, Ta, and/or TaN, although other materials may be employed.

The seed layer 14 may be formed using a physical-vapor-deposition (PVD) process (e.g., sputtering). The seed layer 14 preferably includes a metal, and in particular, the seed layer 14 includes materials that display magnetic properties. The seed layer 14 may include catalytic metals such as Ni, Co, Pd, etc. where no activation is required. Otherwise, other metals (e.g., Cu), can be employed along with an activation step. In a particularly useful embodiment, the seed layer 14 includes a $Ni_{80}Fe_{20}$ film, 30-50 nm thick. A bias magnetic field can be applied during seed layer 14 deposition to produce magnetic anisotropy. Other processes such as annealing in the presence of a magnetic field may be performed after the seed layer 14 is formed to produce magnetic anisotropy.

A top layer or protective layer 16, which is optional, may be employed to protect the seed layer 14. The top layer 16 may include Ti although any metal or even non-metal may be employed. The passive top layer 16 may be removed just before plating to ensure a pristine seed layer surface.

Figure 2:
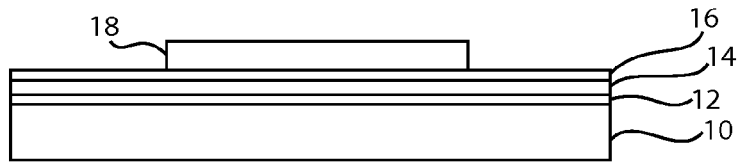
FIG. 2 is a cross-sectional view of the substrate of FIG. 1 having a lithographic resist mask formed thereon to pattern the seed layer in accordance with the present principles.

Referring to FIG. 2, a resist 18, such as a photoresist, is applied to a surface of the seed layer 14 or to the top layer 16, if employed. The resist 18 is patterned to achieve the desired shape of the seed layer 14, as will be described.

Figure 3:
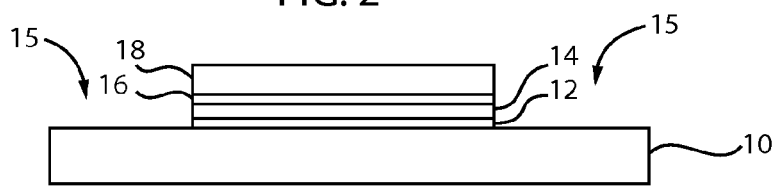
FIG. 3 is a cross-sectional view of the substrate of FIG. 2 having the adhesion layer, the seed layer and the protective layer patterned in accordance with the present principles.

Referring to FIG. 3, lithographic patterning of the seed layer 14 is performed. This includes the patterning of the adhesion layer 12 and the top layer 16, if employed. A wet etch may be employed to remove the seed layer 14 from a field region 15. The seed layer 14 is patterned using the photoresist mask 18. Instead of removing the seed layer 14, a portion of the seed layer 14 may be isolated by covering other regions. For example, in FIG. 2, the top layer 16 in the field region 15 may be treated (oxidized) to form an oxide (e.g., titanium oxide) or other compound. The resist 18 can be removed and the untreated top layer 16 may be removed to expose the pristine seed layer 14 in the appropriate shape onto which electrolessly deposited structures may be formed. Other methods may also be employed to pattern or expose an appropriate seed layer portion.

Figure 4:
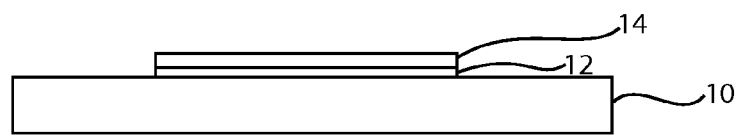
FIG. 4 is a cross-sectional view of the substrate of FIG. 3 having the resist layer and the protective layer removed in accordance with the present principles.
Figure 5:
FIG. 5 is a cross-sectional view of the substrate of FIG. 4 having the seed layer activated in accordance with the present principles.

Referring to FIG. 4, the resist 18 (mask) is removed and the top layer 16 is removed, if present. In one embodiment, an optional activation is performed on the seed layer 14. The activation is performed depending on the type material employed for seed layer 14. In one embodiment, activation includes immersing the wafer or substrate 10 in a Pd-based solution for about 30 seconds to activate the surface of the seed layer 14. An activated layer 20 is formed.

Figure 6:
FIG. 6 is a cross-sectional view of the substrate of FIG. 5 having an electrolessly plated layer formed in accordance with the present principles.

Referring to FIG. 6, an electroless plated layer 22 is formed on the seed layer 14. The wafer/substrate 10 is immersed in a bath and a reaction is carried out to electrolessly form layer 22. Layer 22 may include a cobalt based film, such as CoWP, CoWB, CoP, CoB, CoWPB, CoMoP, CoMoB, etc. Layer 22 is selectively electroless-plated on the patterned seed layer 14 to form yokes or other structures. In one embodiment, Fe may replace Co. Ni and/or Fe may be employed in the layer 22 to adjust magnetic properties. Layer 22 includes an amorphous phase (or nanocrystalline phase) of the Co (or Fe) based material.

Figure 7:
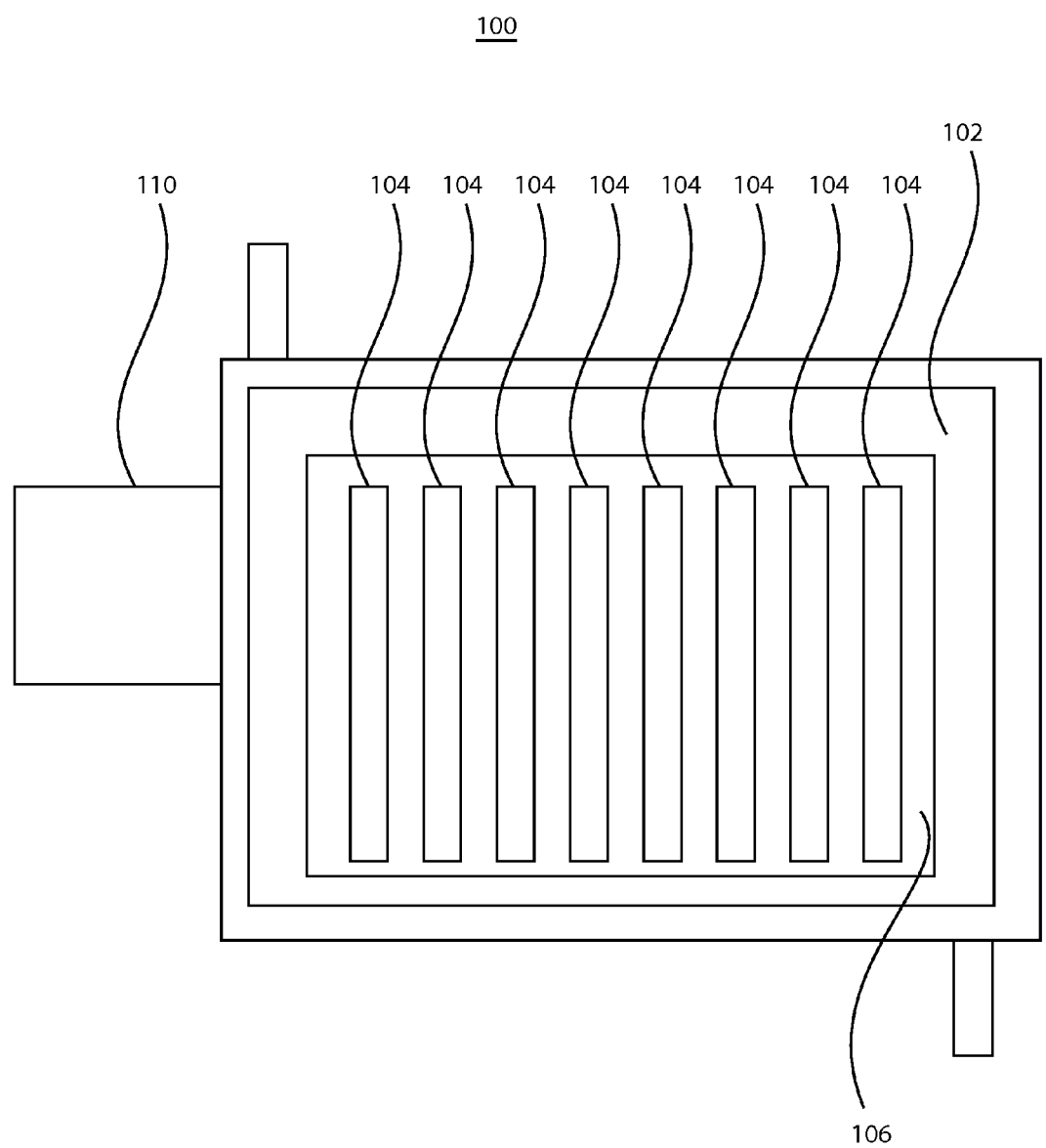
FIG. 7 is a schematic diagram showing an illustrative electroless bath in accordance with the present principles.

Referring to FIG. 7, an illustrative electroless bath 100 is shown in accordance with one exemplary embodiment. The bath 100 includes an electroless solution 102 that may include different chemistries for forming Co or Fe based plating on integrated circuit chips. In one embodiment, multiple wafers 104 are batch processed to reduce time and costs. It should be understood that the wafers 104 may be arranged horizontally, vertically or at any angle in the bath 100 using a holder or stand 106. It should also be understood that individual devices or substrates may be processed in the bath as well.

In particularly useful embodiments, the chemistries employed for plating CoWP, CoWPB and CoWB include the following.

TABLE 1

| Component or property | Description | CoWP | CoWPB | CoWB |
|---|---|---|---|---|
| $CoSO4 \cdot 7H_2O$ (mol/l) | Source of Co | 0.05-0.1 | 0.05-0.1 | 0.05-0.1 |
| $NaH_2PO_2 \cdot H_2O$ (mol/l) | Reducer/source of P | 0.2-0.34 | 0.2-0.34 | — |
| DMAB (mol/l) | Reducer/source of B | — | 0.02-0.04 | 0.02-0.2 |
| $Na_2WO_4 \cdot H_2O$ (mol/l) | Source of W | 0.02-0.2 | 0.02-0.2 | 0.02-0.2 |
| Citric Acid (mol/l) | Complex agent | 0.5 | 0.5 | 0.5 |
| Boric acid (mol/l) | Buffer | 0.5 | 0.5 | 0.5 |
| Pb acetate (ppm) | Stabilizer | 0.1-1 | 0.1-1 | 0.1-1 |
| PEG (ppm) | Surfactant | 2-20 | 2-20 | 2-20 |
| PH | — | 8.5-9.5 | 8.5-9.5 | 8.5-9.5 |
| Temp (C.) | — | 85-95 | 80-95 | 75-95 |

It should be understood that the chemistries shown in Table 1 may include one or more types of stabilizers; one or more types of surfactants; one or more types of buffer (e.g., other than boric acid); one or more complex agents (e.g., other than citric acid); etc. In addition, W can be replaced or partially replaced by other refractory metal or metals, e.g., Mo, Re, etc. Other sources or reducers may also be employed.

A controller or computer device 110 may be employed to control conditions in the bath. For example, the controller 110 may control mixing (agitators or mixers (not shown)), control temperature (using a thermocouple(s) and heaters (not shown)), control pH (by monitoring pH and introducing chemistries (e.g., buffers) as needed), etc. The controller 110 may also include alarms and timing controls to ensure high quality electroless plating parameters.

Referring to FIGS. 8-13, another illustrative structure is described, which employs an electroless Co based plating process in accordance with the present principles.

Figure 8:
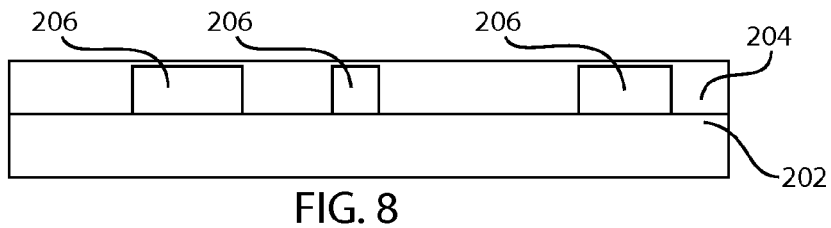
FIG. 8 is a cross-sectional view of a substrate having a dielectric layer with damascene metal structure formed therein in accordance with the present principles.

Referring to FIG. 8, a substrate 202 has a dielectric layer 204 formed thereon. The substrate 202 may include any substrate material including but not limited to silicon, germanium, GaAs, quartz, sapphire, etc. The dielectric layer 204 may include silicon oxide, although other dielectric materials are also contemplated. The dielectric layer 204 may be patterned and conductive structures 206 formed using, e.g., a damascene process.

Figure 9:
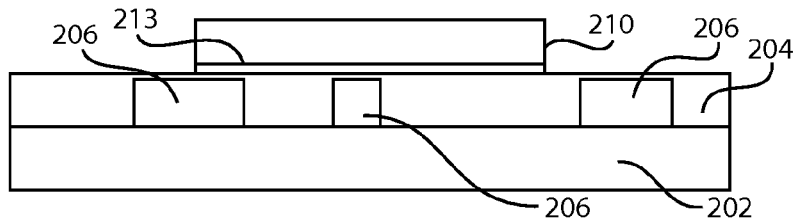
FIG. 9 is a cross-sectional view of the substrate of FIG. 8 having an electrolessly plated layer formed on a seed layer in accordance with the present principles.

Referring to FIG. 9, a seed layer 213 is formed and patterned. Followed by an electroless plating process to form a Co based bottom yoke 210. The seed layer 213 preferably includes a magnetic material and may be formed in the presence of a magnetic bias field. An adhesion layer may be employed and formed prior to the seed layer 213 but is not shown. The bottom yoke 210 may include CoWP or other Co based materials. The seed layer 213 may include a Ti layer patterned to the shape of the yoke 210 or the seed layer 213 may include a protective Ti layer thereon and oxidized in the field around the location for forming the yoke 210 where the Ti remains intact where a footprint of the yoke 210 is to be formed. This may include forming a patterned resist where the footprint of the yoke 210 is to be formed (to protect the Ti from oxidation).

Figure 10:
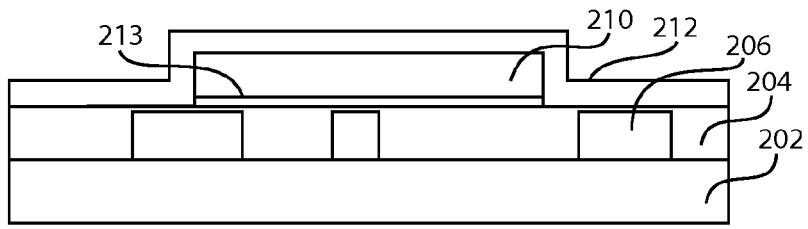
FIG. 10 is a cross-sectional view of the substrate of FIG. 9 having a dielectric layer formed on the plated layer in accordance with the present principles.

Referring to FIG. 10, depending on the method of creating the seed layer 213, a field etch can be performed to remove the seed layer 213 from areas beyond the yoke 210. This may include a wet etch or other suitable etch process. A dielectric encapsulation layer 212 is formed over the yoke 210 and the field region surrounding the yoke 210. The dielectric encapsulation layer 212 may include an oxide such as TEOS, or the like.

Figure 11:
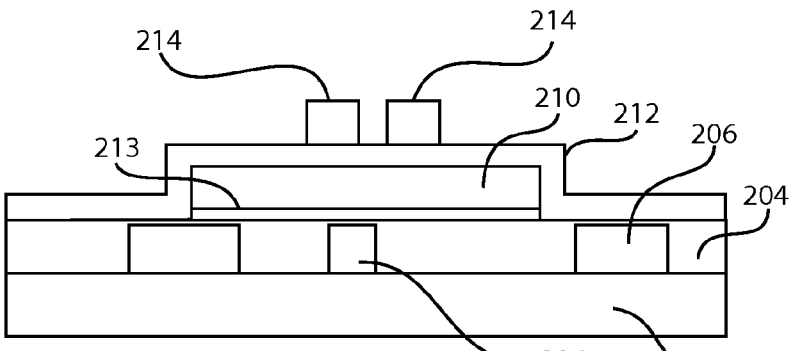
FIG. 11 is a cross-sectional view of the substrate of FIG. 10 having coils or structures formed over the plated layer on the dielectric layer in accordance with the present principles.

Referring to FIG. 11, a mask (not shown) is formed over the yoke 210 on the layer 212. The mask is employed to form electroplated coils 214. The electroplated coils 214 may include copper or other metals. The coils 214 may also be formed by electroless processing or by other methods.

Figure 12:
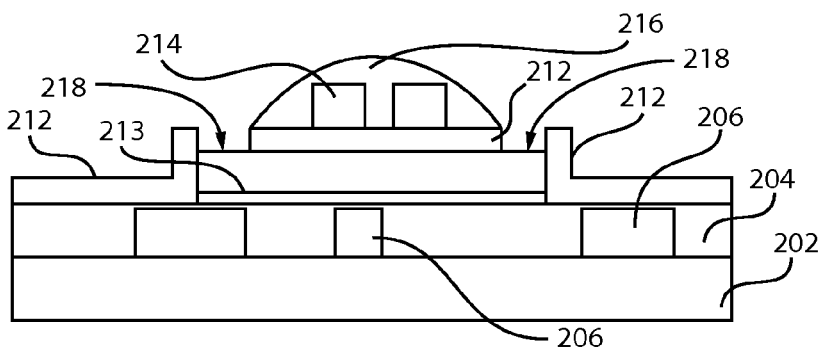
FIG. 12 is a cross-sectional view of the substrate of FIG. 11 having a hardbaked photoresist formed over the coils or structures, and openings formed in the dielectric layer to expose the plated layer in accordance with the present principles.

Referring to FIG. 12, a photoresist 216 is deposited and patterned using a lithographic process to encapsulate the coils 214 over the yoke 210. The photoresist 216 is reflowed to obtain a domed or curved shape by relying on surface tension in the photoresist 216. Then, the photoresist 216 is hardbaked. Portions 218 of the layer 212 are opened up over the yoke 210. This may be performed using a patterned etch mask.

Figure 13:
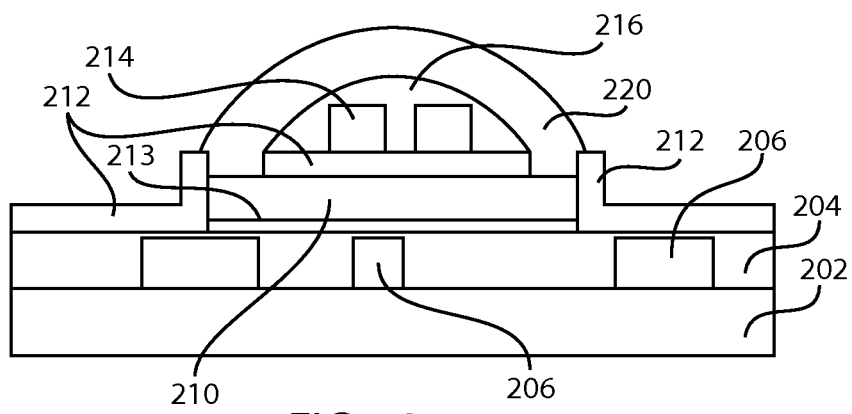
FIG. 13 is a cross-sectional view of the substrate of FIG. 12 having another plated layer formed over the hardbaked photoresist and the exposed portions of the plated layer in accordance with the present principles.

Referring to FIG. 13, a top yoke 220 is formed using the bottom yoke 210 as a seed layer and growing the top yoke 220 over the hardbaked photoresist 216. The top yoke 220 preferably includes a same material as the bottom yoke 210 although different materials or alloys may be employed.

By employing electroless plating in accordance with the present principles, thermal budget is minimized by using low temperature processing. In addition, the electroless plating process can be employed to control an amount of Ni or Fe to accurately adjust magnetic properties of the plated material. It should be understood that the yoke structure, the coils and the interconnections may be arranged in different shapes and configurations from those illustratively depicted in the FIGs.

Referring to FIGS. 14-19, another illustrative structure is described, which employs an electroless Co based plating process to form a shielded slab inductor in accordance with the present principles.

Figure 14:
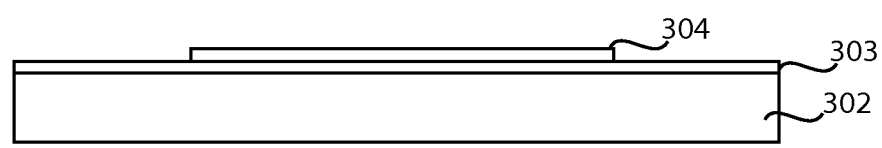
FIG. 14 is a cross-sectional view of a substrate having a patterned seed layer formed thereon in accordance with the present principles.

Referring to FIG. 14, a substrate 302 has a dielectric layer or adhesion layer 303 and a seed layer 304 formed thereon. The substrate 302 may include any substrate material including but not limited to silicon, germanium, GaAs, quartz, sapphire, etc. The seed layer 304 may include Fe, Ni, Co or other magnetic metals, alloys or materials. The seed layer 304 is patterned or otherwise processed to provide seed areas. The seed layer 304 may be activated, if needed. The dielectric layer 303 may include an oxide, e.g., $SiO_2$. An appropriate material may be selected for layer 303 to function as an adhesion layer as well.

Figure 15:
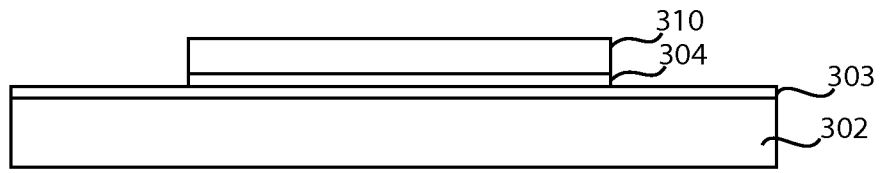
FIG. 15 is a cross-sectional view of the substrate of FIG. 14 having an electrolessly plated layer formed in accordance with the present principles.

Referring to FIG. 15, an electroless plating process is carried out to form a Co based shield 310. The shield 310 may include CoWP or other alloys. It should be noted that the inductors, coils, slabs, shields, yokes or other structures depicted in the FIGS. are in cross-section and may include spirals, nested shapes, curves, etc. in top views.

Figure 16:
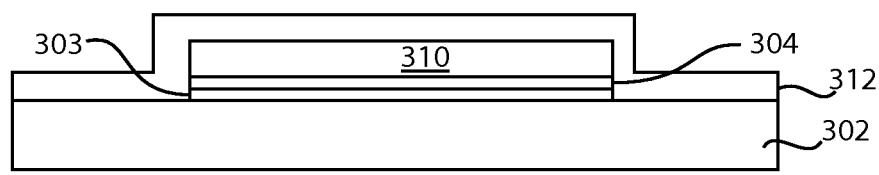
FIG. 16 is a cross-sectional view of the substrate of FIG. 15 having a dielectric layer formed over the plated layer in accordance with the present principles.

Referring to FIG. 16, a dielectric layer 312 is deposited over the shield 310. The dielectric layer 312 may include an oxide, such as a silicon oxide, although other dielectric materials may be employed.

Figure 17:
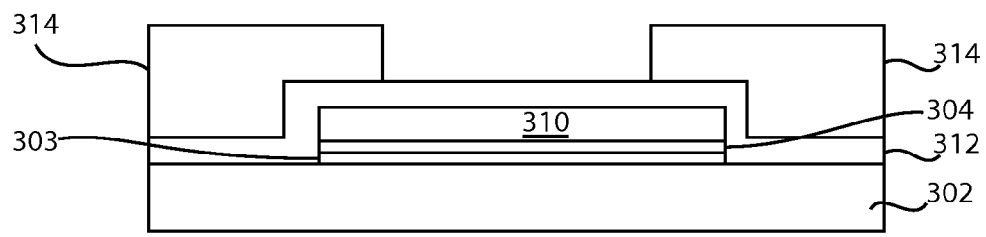
FIG. 17 is a cross-sectional view of the substrate of FIG. 16 having a resist layer patterned to form a mask or mold in accordance with the present principles.

Referring to FIG. 17, a photoresist 314 is deposited over the dielectric layer 312 and is patterned to form a mask or mold for further processing. Here, an opening 316 is formed over the shield 310 for forming a slab inductor contact over the shield 310.

Figure 18:
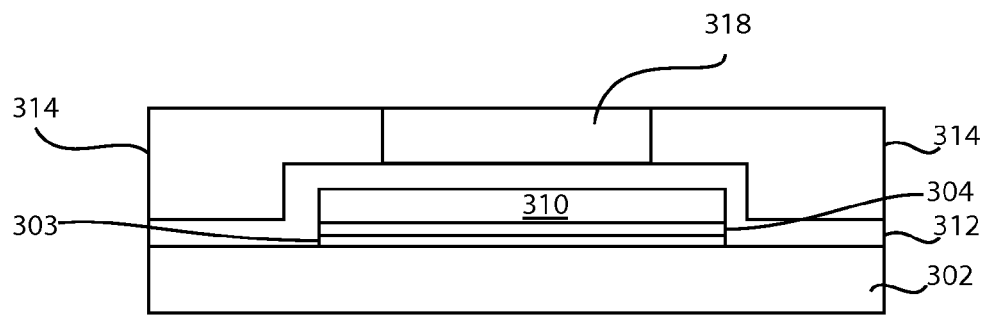
FIG. 18 is a cross-sectional view of the substrate of FIG. 17 having a conductive material formed in the mask or mold in accordance with the present principles.
Figure 19:
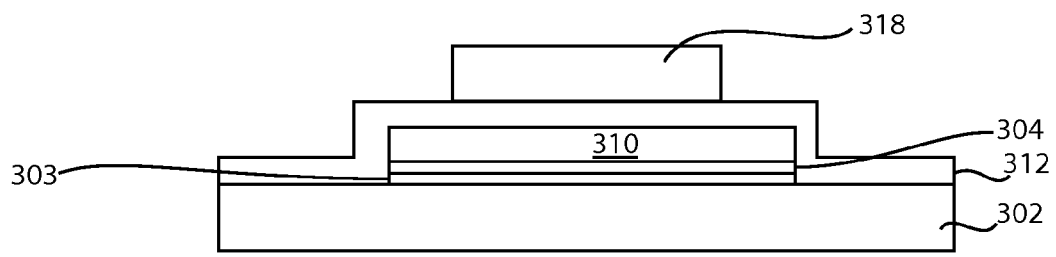
FIG. 19 is a cross-sectional view of the substrate of FIG. 18 after the mask or mold is removed to form a shielded slab inductor in accordance with the present principles.

Referring to FIG. 18, a conductive material 318 is deposited or plated through the mask of photoresist 314. The conductive material may include copper or other highly conductive material to form an inductor, inductor electrode and/or contact 318. The photoresist 314 is then removed as shown in FIG. 19 to provide a shielded-slab inductor structure in accordance with the present principles.

The use of electroless plated, amorphous Co magnetic films and patterned arrays for inductor applications provide inexpensive deposition costs, selectivity of deposition, excellent conformal coverage, and the ability to plate multiple wafers simultaneously. The electroless-plated Co films (e.g., CoWP) show excellent magnetic properties.

Figure 20:
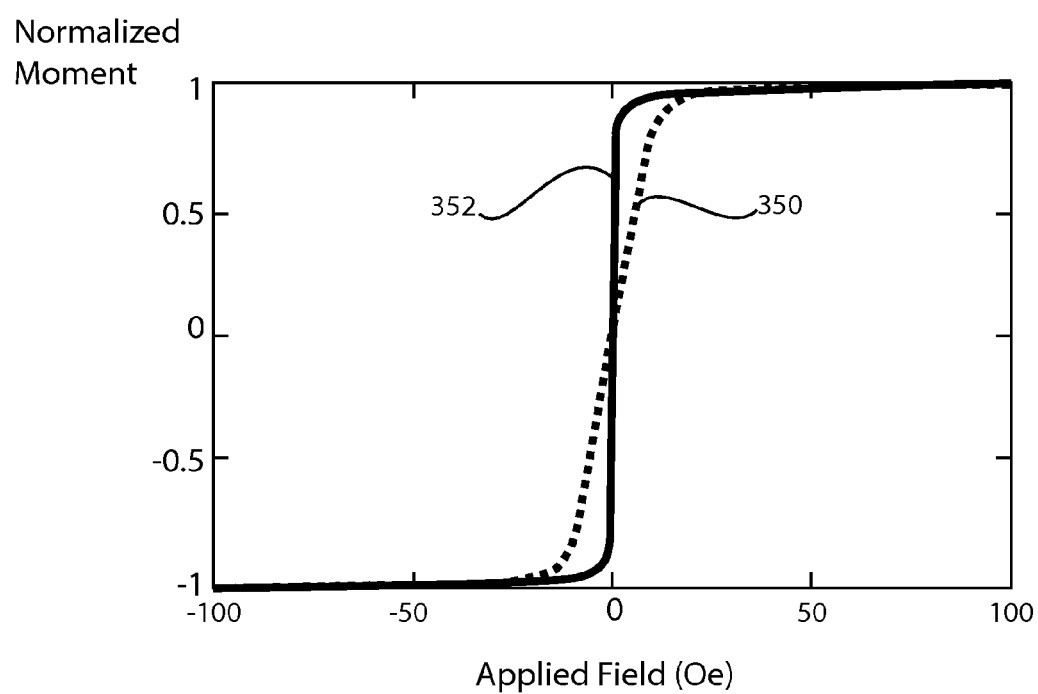
FIG. 20 is a plot showing normalized moment versus applied field in Oe for an electroless plated CoWP film in accordance with the present principles.

Referring to FIG. 20, normalized moment is plotted against applied field in Oe for an electroless plated CoWP film. The film shows good magnetic anisotropy and low coercivity of less than 0.1 Oe along both an easy axis 352 and a hard axis of the hysteresis. The easy axis plot 352 is a hysteresis with lines almost coinciding due to the small 0.1 Oe coercivity offset. The same is true for the hard axis plot 350 which has a hysteresis with lines almost coinciding due to the small 0.1 Oe coercivity offset. The resistivity of the films is about 90-130 $\mu\Omega \cdot cm$, which is close to that of most amorphous Co-based alloys. The electroless plating can be performed inside a DC magnetic field, and/or the electroless-plated magnetic yokes can be post annealed in a DC magnetic field, to define magnetic anisotropy.

Most compositions used for conventional diffusion barriers having a Co composition include Co content of greater than 90 atomic percent (at %) Co. These barriers do not provide magnetic properties and act only to prevent diffusion. In accordance with the present principles, the Co atomic percent is less than 90% to achieve better magnetic properties. In accordance with particularly useful embodiments, Co at 10-15 at % is particularly useful, although other percentages are also contemplated. Atomic percent of Co, Ni, Fe, etc. can be carefully and inexpensively controlled for electrolessly deposited magnetic layers. In addition, microstructure, particularly in thick films, can be controlled which can also contribute to magnetic performance (e.g., columnar grains will degrade magnetic performance are avoided in the electroless process).

Figure 21:
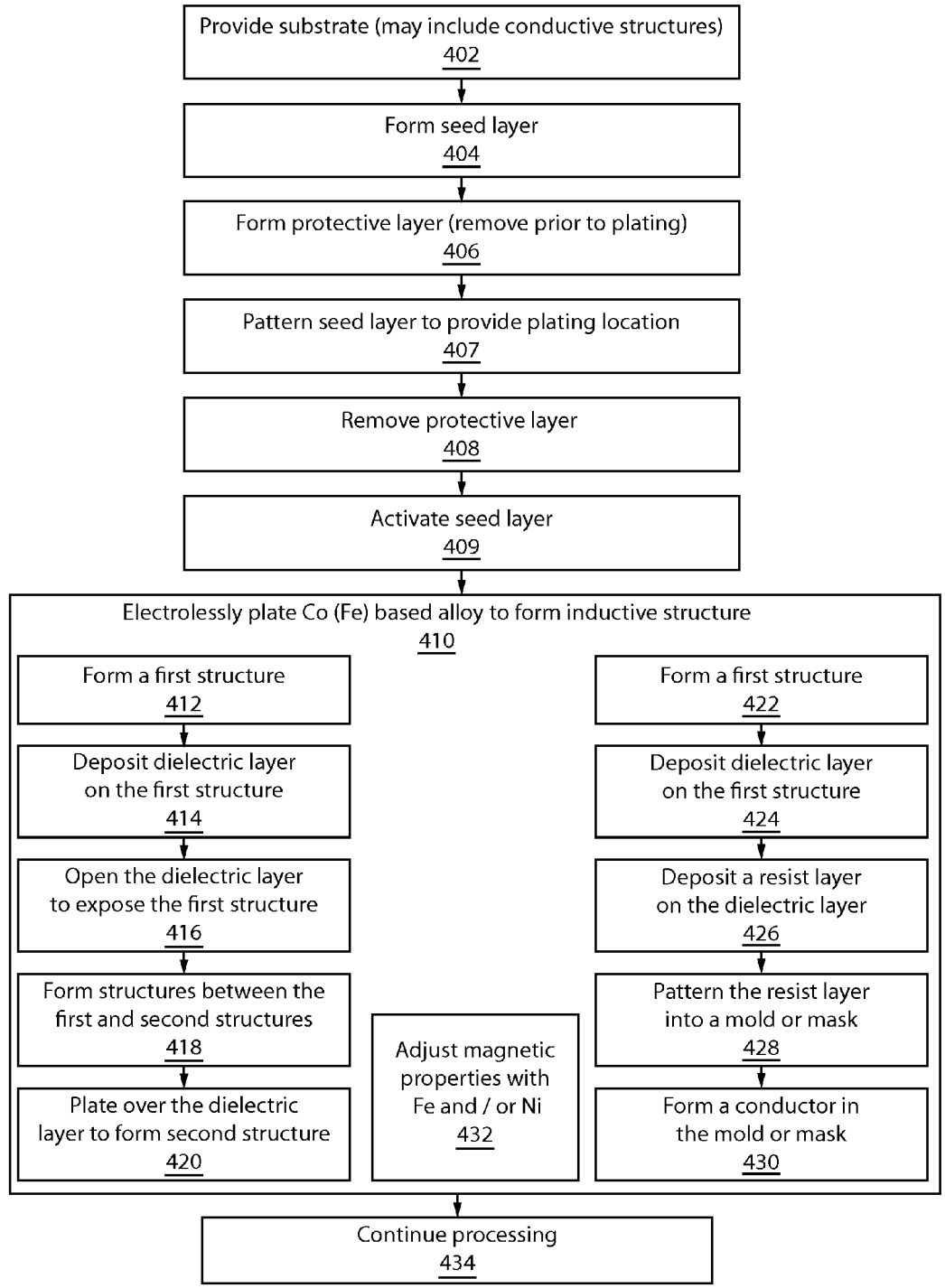
FIG. 21 is a block/flow diagram showing methods for forming an on-chip magnetic structure using electroless plating in accordance with illustrative embodiments.

Referring to FIG. 21, methods for forming an on-chip magnetic structure using electroless plating are illustratively depicted. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 402, a substrate is provided where a conductive material is to be formed. This may include depositing conductive structures, such as metal lines that may connect to the metal structure. In other embodiments, coils or inductive bodies may be formed in a dielectric layer as the case may be. In block 404, a seed layer is formed over a substrate of a semiconductor chip. The seed layer may be formed over a dielectric material, on a metal layer or on an adhesion layer. The metal/adhesion layer may include, e.g., Ti, Ta, TaN, etc. In block 406, a protective layer may be formed over the seed layer. The protective layer is removed prior to electroless plating in block 408.

In block 407, the seed layer is patterned to provide a plating location. The patterning may employ lithographic patterning using a resist and wet etching. Other patterning techniques may also be employed. For example, a mask may be formed by lithography to cover plating locations and an oxidation process may be employed to oxidize the metal layer. Then, by removing the mask, the metal layer is ready for the plating while the oxidized metal is not.

In block 409, depending on the metal employed for the seed layer, an optional seed layer activation process may be employed. Activating may include coating or dipping the seed layer in a solution, e.g., a Pd-based solution.

In block 410, a cobalt based alloy is electrolessly plated at the plating location to form an inductive structure (or portion thereof) on the semiconductor chip. Fe may be employed as well instead of or in addition to the Co. The inductive structure may include a yoke, a portion of a yoke, an inductor coil, a transformer coil or coils, rings, magnets, or any other magnetic structure or portions thereof. In particularly useful embodiments, an electrolessly plated cobalt based alloy is employed that includes at least one of CoWP, CoWB, CoP, CoB, CoWPB, CoMoB, and CoMoP. Other structures may also be employed including Fe based structures.

Electrolessly plating includes: forming a first structure on the seed layer by electroless plating in block 412, depositing a dielectric material on the first structure in block 414; opening at least one opening in the dielectric material to expose a portion of the first structure in block 416; and electrolessly plating in block 420 over the dielectric layer by growing the cobalt based alloy over the dielectric layer from the at least one opening to form a second structure.

The first structure may include a bottom yoke and the second structure may include a top yoke, and conductors, such as, e.g., inductor coils may be formed on the dielectric layer between the bottom yoke and the top yoke in block 418.

In another embodiment, electrolessly plating includes: forming a first structure on the seed layer by electroless plating in block 422; depositing a dielectric material on the first structure in block 424; depositing a resist material on the dielectric layer in block 426; patterning the resist material to form a mask or mold in block 428; and forming a conductor in the mask or mold by plating in block 430. The first structure formed in block 422 may function as a magnetic shield for the conductor formed in block 430, and these together may function as a shielded-slab inductor.

In block 432, the plating process may be adjusted to introduce Fe and/or Ni to influence magnetic properties of the inductive structure. This is provided contemporaneously during electroless plating in, e.g., blocks 412, 420, 422, 430, etc. In block 434, processing continues to complete the structures or devices.

Having described preferred embodiments for electroless plating of cobalt alloys for on chip inductors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming an on-chip magnetic structure, comprising:
    forming a seed layer from a material that displays magnetic properties over a substrate of a semiconductor chip;
    patterning the seed layer to provide a plating location; and
    electrolessly plating a cobalt based alloy at the plating location to form a magnetic structure on the semiconductor chip.

2. The method as recited in claim 1, wherein the magnetic structure includes a yoke or a coil.

3. The method as recited in claim 1, wherein electrolessly plating the cobalt based alloy includes:
    forming a first structure on the seed layer by electroless plating;
    depositing a dielectric material on the first structure;
    opening at least one opening in the dielectric material to expose a portion of the first structure; and
    electrolessly plating over the dielectric layer by growing the cobalt based alloy over the dielectric layer from the at least one opening to form a second structure.

4. The method as recited in claim 1, wherein electrolessly plating the cobalt based alloy includes:
    forming a first structure on the seed layer by electroless plating;
    depositing a dielectric material on the first structure;
    depositing a resist material on the first structure;
    patterning the resist material to form a mask or mold; and
    forming a conductor in the mask or mold.

5. The method as recited in claim 1, further comprising forming a protective layer over the seed layer; and removing the protective layer prior to electrolessly plating the cobalt based alloy.

6. The method as recited in claim 1, further comprising activating the seed layer.

7. The method as recited in claim 1, wherein electrolessly plating the cobalt based alloy includes electrolessly plating at least one of CoWP, CoWB, CoP, CoB, CoWPB, CoMoB, and CoMoP.

8. The method as recited in claim 1, further comprising adjusting magnetic properties of the magnetic structure by providing one of Fe and Ni during the electrolessly plating step.

9. The method as recited in claim 3, wherein the first structure includes a bottom yoke and the second structure includes a top yoke, the method further comprising:
    forming inductor coils on the dielectric layer between the bottom yoke and the top yoke.

10. The method as recited in claim 4, wherein the first structure includes a shield for a slab inductor with the conductor being an inductor electrode.

11. A method for forming an on-chip magnetic structure, comprising:
    forming an adhesion layer over a substrate of a semiconductor chip;
    forming a seed layer on the adhesion layer;
    forming a protective layer over the seed layer;
    patterning the seed layer and the protective layer to provide a plating location;
    removing the protective layer; and
    electrolessly plating a cobalt or iron based alloy at the plating location to form a magnetic structure on the semiconductor chip.

12. The method as recited in claim 11, wherein electrolessly plating includes:
  forming a first structure on the seed layer by electroless plating;
  depositing a dielectric material on the first structure;
  opening at least one opening in the dielectric material to expose a portion of the first structure;
  electrolessly plating over the dielectric layer by growing the alloy over the dielectric layer from the at least one opening to form a second structure; and
  forming inductor coils on the dielectric layer between the first structure and the second structure wherein the first structure includes a bottom yoke and the second structure includes a top yoke.

13. The method as recited in claim 11, wherein electrolessly plating includes:
  forming a first structure on the seed layer by electroless plating;
  depositing a dielectric material on the first structure;
  depositing a resist material on the first structure;
  patterning the resist material to form a mask or mold; and
  forming a conductor in the mask or mold plating, wherein the first structure forms a shield for a slab inductor with the conductor being the electrode of an inductor.

14. The method as recited in claim 11, wherein electrolessly plating includes electrolessly plating at least one of CoWP, CoWB, CoP, CoB, CoWPB, CoMoB, and CoMoP.

15. The method as recited in claim 11, further comprising adjusting magnetic properties of the magnetic structure by providing one of Fe and Ni during the electrolessly plating step.

16. A method for forming an on-chip magnetic structure, comprising:
  forming a seed layer from a non-magnetic material over a substrate of a semiconductor chip;
  patterning the seed layer to provide a plating location;
  activating the seed layer by dipping the chip in an activating solution; and
  electrolessly plating a cobalt based alloy at the plating location to form a magnetic structure on the semiconductor chip.

17. The method as recited in claim 16, wherein electrolessly plating the cobalt based alloy includes:
  forming a first structure on the seed layer by electroless plating;
  depositing a dielectric material on the first structure;
  opening at least one opening in the dielectric material to expose a portion of the first structure; and
  electrolessly plating over the dielectric layer by growing the cobalt based alloy over the dielectric layer from the at least one opening to form a second structure.

18. The method as recited in claim 16, wherein electrolessly plating the cobalt based alloy includes:
  forming a first structure on the seed layer by electroless plating;
  depositing a dielectric material on the first structure;
  depositing a resist material on the first structure;
  patterning the resist material to form a mask or mold; and
  forming a conductor in the mask or mold.

19. The method as recited in claim 16, further comprising forming a protective layer over the seed layer; and removing the protective layer prior to electrolessly plating the cobalt based alloy.

20. The method as recited in claim 16, further comprising adjusting magnetic properties of the magnetic structure by providing one of Fe and Ni during the electrolessly plating step.

\* \* \* \* \*